(12) United States Patent
Kaslusky et al.

(10) Patent No.: US 11,024,558 B2
(45) Date of Patent: Jun. 1, 2021

(54) HEAT TRANSFER DEVICE WITH FINS DEFINING AIR FLOW CHANNELS

(71) Applicant: Hamilton Sundstrand Corporation, Charlotte, NC (US)

(72) Inventors: Scott F. Kaslusky, West Hartford, CT (US); Brian St. Rock, Andover, CT (US); John H. Whiton, South Windsor, CT (US); Vincent C. Nardone, South Windsor, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 109 days.

(21) Appl. No.: 16/158,442

(22) Filed: Oct. 12, 2018

(65) Prior Publication Data

US 2019/0043783 A1     Feb. 7, 2019

Related U.S. Application Data

(63) Continuation of application No. 12/732,320, filed on Mar. 26, 2010, now Pat. No. 10,103,089.

(51) Int. Cl.
*F28F 7/00*       (2006.01)
*H01L 23/467*    (2006.01)
*H01L 23/367*    (2006.01)

(52) U.S. Cl.
CPC ........ *H01L 23/467* (2013.01); *F28F 2215/08* (2013.01); *H01L 23/3672* (2013.01); *H01L 2924/0002* (2013.01)

(58) Field of Classification Search
CPC .............. H01L 23/467; H01L 23/3672; H01L 2924/0002; F28F 2215/08

USPC ......................................................... 165/80.3
See application file for complete search history.

(56) References Cited

U.S. PATENT DOCUMENTS

| | | | |
|---|---|---|---|
| 2,834,582 A | 5/1958 | Kablitz | |
| 3,466,909 A * | 9/1969 | Weber Ernesto J | B21K 1/30 72/68 |
| 3,592,260 A | 7/1971 | Berger | |
| 4,838,041 A * | 6/1989 | Bellows | F25B 19/005 165/80.2 |
| 5,132,780 A | 7/1992 | Higgins, III | |
| 5,294,831 A | 3/1994 | Azar et al. | |
| 5,597,034 A * | 1/1997 | Barker, III | H01L 23/467 165/121 |
| 5,661,638 A * | 8/1997 | Mira | H01L 23/467 165/126 |

(Continued)

FOREIGN PATENT DOCUMENTS

| EP | 1253638 A2 | 10/2002 |
|---|---|---|
| EP | 1526570 A2 | 4/2005 |

(Continued)

OTHER PUBLICATIONS

European Search Report for EP Application No. 11250380.0 dated Nov. 29, 2012.

*Primary Examiner* — Claire E Rojohn, III
(74) *Attorney, Agent, or Firm* — Carlson, Gaskey & Olds, P.C.

(57) ABSTRACT

An exemplary cooling system includes a heat transfer device having a base and a plurality of curved fins defining a curved air flow channel. Air flow is provided through the air flow channel, and a plurality of openings through a fin communicate air flow from a first side to a second side of the curved fin.

16 Claims, 6 Drawing Sheets

(56) References Cited

U.S. PATENT DOCUMENTS

| | | | | |
|---|---|---|---|---|
| 5,704,417 A * | 1/1998 | Christensen | F28F 3/027 | |
| | | | 165/110 | |
| 5,794,685 A * | 8/1998 | Dean | H01L 23/367 | |
| | | | 165/121 | |
| 5,854,739 A * | 12/1998 | Steiner | H01L 23/473 | |
| | | | 361/703 | |
| 5,867,365 A | 2/1999 | Chiou | | |
| 5,927,385 A * | 7/1999 | Yeh | H01L 23/467 | |
| | | | 165/121 | |
| 5,943,209 A * | 8/1999 | Liu | H01L 23/467 | |
| | | | 165/185 | |
| 5,957,659 A * | 9/1999 | Amou | H01L 23/367 | |
| | | | 257/E23.099 | |
| 6,014,008 A | 1/2000 | Hartzell et al. | | |
| 6,015,008 A * | 1/2000 | Kogure | F28F 3/02 | |
| | | | 165/185 | |
| 6,130,818 A | 10/2000 | Severson | | |
| 6,134,108 A * | 10/2000 | Patel | H01L 23/467 | |
| | | | 165/908 | |
| 6,161,610 A | 12/2000 | Azar | | |
| 6,170,563 B1 * | 1/2001 | Hsieh | F28F 3/04 | |
| | | | 165/122 | |
| 6,179,046 B1 * | 1/2001 | Hwang | H01L 23/467 | |
| | | | 165/121 | |
| 6,196,300 B1 | 3/2001 | Checchetti | | |
| 6,199,624 B1 | 3/2001 | Woking | | |
| 6,244,331 B1 * | 6/2001 | Budelman | F28F 3/022 | |
| | | | 165/121 | |
| 6,269,003 B1 * | 7/2001 | Wen-Chen | H01L 23/3672 | |
| | | | 165/80.3 | |
| 6,313,399 B1 | 11/2001 | Suntio et al. | | |
| 6,371,200 B1 * | 4/2002 | Eaton | C06B 25/02 | |
| | | | 165/104.33 | |
| 6,382,306 B1 * | 5/2002 | Hsu | F28F 3/02 | |
| | | | 165/80.3 | |
| 6,419,007 B1 * | 7/2002 | Ogawara | F28F 13/00 | |
| | | | 165/185 | |
| 6,446,707 B1 * | 9/2002 | White | H01L 23/367 | |
| | | | 165/121 | |
| 6,479,895 B1 | 11/2002 | Lee et al. | | |
| 6,505,680 B1 * | 1/2003 | Hegde | H01L 23/467 | |
| | | | 165/121 | |
| 6,525,939 B2 * | 2/2003 | Liang | H01L 23/4093 | |
| | | | 165/121 | |
| 6,535,385 B2 * | 3/2003 | Lee | H01L 23/3672 | |
| | | | 165/104.33 | |
| 6,538,892 B2 | 3/2003 | Smalc | | |
| 6,543,522 B1 * | 4/2003 | Hegde | F28F 3/02 | |
| | | | 165/185 | |
| 6,587,341 B1 * | 7/2003 | Wei | H01L 23/467 | |
| | | | 165/122 | |
| 6,633,484 B1 | 10/2003 | Lee et al. | | |
| 6,657,862 B2 * | 12/2003 | Crocker | H01L 23/3672 | |
| | | | 165/121 | |
| 6,659,169 B1 * | 12/2003 | Lopatinsky | H01L 23/467 | |
| | | | 165/121 | |
| 6,664,673 B2 * | 12/2003 | Lopatinsky | F04D 25/0653 | |
| | | | 257/E23.099 | |
| 6,668,915 B1 | 12/2003 | Matema | | |
| 6,671,172 B2 * | 12/2003 | Carter | H01L 23/3672 | |
| | | | 165/121 | |
| 6,675,881 B1 * | 1/2004 | Rago | F28D 7/106 | |
| | | | 138/38 | |
| 6,698,499 B1 * | 3/2004 | Wagner | H01L 23/467 | |
| | | | 165/121 | |
| 6,714,415 B1 * | 3/2004 | Shah | H01L 23/467 | |
| | | | 165/185 | |
| 6,755,242 B2 | 6/2004 | White | | |
| 6,865,085 B1 * | 3/2005 | Ferris | H05K 7/20445 | |
| | | | 361/721 | |
| 6,873,069 B1 * | 3/2005 | Odagiri | H01L 23/467 | |
| | | | 310/64 | |
| 6,883,592 B2 * | 4/2005 | Lee | H01L 23/3677 | |
| | | | 165/185 | |
| 6,886,627 B2 | 5/2005 | Kozyra et al. | | |
| 6,913,069 B2 * | 7/2005 | Barsun | F28F 3/02 | |
| | | | 165/185 | |
| 6,937,473 B2 * | 8/2005 | Cheng | F28F 3/02 | |
| | | | 165/185 | |
| 6,986,384 B2 * | 1/2006 | Wagner | F28D 15/0233 | |
| | | | 165/104.21 | |
| 7,120,020 B2 | 10/2006 | Carter et al. | | |
| 7,136,285 B1 * | 11/2006 | Herbert | F04D 29/281 | |
| | | | 361/695 | |
| 7,156,620 B2 | 1/2007 | Papple | | |
| 7,188,418 B2 | 3/2007 | Shah | | |
| 7,193,849 B2 * | 3/2007 | Xu | F04D 29/582 | |
| | | | 165/80.3 | |
| 7,200,934 B2 | 4/2007 | Carter et al. | | |
| 7,311,137 B2 | 12/2007 | Thors et al. | | |
| 7,331,380 B2 * | 2/2008 | Ghosh | H01L 23/473 | |
| | | | 165/104.33 | |
| 7,361,081 B2 | 4/2008 | Beitelmal et al. | | |
| 7,362,573 B2 * | 4/2008 | Lu | H01L 23/4006 | |
| | | | 165/185 | |
| 7,467,467 B2 * | 12/2008 | Prociw | B22F 7/004 | |
| | | | 29/890.03 | |
| 7,532,472 B2 * | 5/2009 | Lin | H01L 23/4006 | |
| | | | 165/104.33 | |
| 7,623,348 B2 * | 11/2009 | Otsuki | H01L 23/3672 | |
| | | | 165/121 | |
| 7,631,987 B2 * | 12/2009 | Wei | F21V 29/004 | |
| | | | 362/294 | |
| 7,688,592 B2 * | 3/2010 | Gruendler | H01L 23/4093 | |
| | | | 361/719 | |
| 7,753,106 B2 | 7/2010 | Lin et al. | | |
| 7,760,506 B1 | 7/2010 | Wang et al. | | |
| 7,814,967 B2 | 10/2010 | Harman | | |
| 7,889,501 B2 * | 2/2011 | Shioiri | H01F 27/085 | |
| | | | 361/707 | |
| 7,896,611 B2 * | 3/2011 | Khanna | H01L 23/467 | |
| | | | 415/177 | |
| 7,911,790 B2 | 3/2011 | Carter et al. | | |
| 7,929,293 B2 * | 4/2011 | Cao | H01L 23/467 | |
| | | | 361/679.47 | |
| 7,963,035 B2 * | 6/2011 | Wei | F21V 29/773 | |
| | | | 29/890.03 | |
| 7,992,624 B2 * | 8/2011 | Huang | F21V 29/83 | |
| | | | 165/80.3 | |
| 8,087,456 B2 * | 1/2012 | Wei | F21V 29/773 | |
| | | | 165/185 | |
| 8,228,675 B2 * | 7/2012 | Koplow | F28F 13/125 | |
| | | | 361/697 | |
| 8,256,258 B2 * | 9/2012 | Yamaoka | H01L 23/467 | |
| | | | 72/253.1 | |
| 2001/0010264 A1 * | 8/2001 | Kuo | H01L 23/3672 | |
| | | | 165/185 | |
| 2002/0017378 A1 * | 2/2002 | Hu | H05K 7/20172 | |
| | | | 165/80.3 | |
| 2002/0036893 A1 * | 3/2002 | Cho | H01L 23/467 | |
| | | | 361/709 | |
| 2002/0100577 A1 * | 8/2002 | Wagner | H01L 23/467 | |
| | | | 165/80.3 | |
| 2002/0121358 A1 * | 9/2002 | Lee | H01L 23/467 | |
| | | | 165/80.3 | |
| 2002/0121365 A1 * | 9/2002 | Kozyra | H01L 23/467 | |
| | | | 165/185 | |
| 2002/0139515 A1 * | 10/2002 | Azar | F28F 3/02 | |
| | | | 165/80.3 | |
| 2002/0144809 A1 * | 10/2002 | Siu | F28F 3/02 | |
| | | | 165/185 | |
| 2002/0162647 A1 * | 11/2002 | Wagner | H01L 23/3672 | |
| | | | 165/121 | |
| 2002/0170703 A1 * | 11/2002 | Huang | F28F 3/04 | |
| | | | 165/80.3 | |
| 2002/0171139 A1 * | 11/2002 | Lee | H01L 23/3672 | |
| | | | 257/720 | |
| 2002/0179290 A1 | 12/2002 | Larson | | |

(56) References Cited

U.S. PATENT DOCUMENTS

| | | | | |
|---|---|---|---|---|
| 2002/0195228 A1* | 12/2002 | Corti | H01L 23/3672 | 165/80.3 |
| 2003/0006024 A1* | 1/2003 | Wang | H02K 5/18 | 165/80.3 |
| 2003/0024688 A1* | 2/2003 | Dowdy | H01L 23/467 | 165/80.3 |
| 2003/0046967 A1* | 3/2003 | Pollard, II | B21K 1/36 | 72/68 |
| 2003/0102110 A1* | 6/2003 | Wagner | F28F 1/105 | 165/80.3 |
| 2003/0131970 A1* | 7/2003 | Carter | B21C 23/10 | 165/80.3 |
| 2003/0136545 A1* | 7/2003 | Lin | H01L 23/467 | 165/80.3 |
| 2003/0150596 A1* | 8/2003 | Chen | H01L 23/467 | 165/80.3 |
| 2003/0150597 A1* | 8/2003 | Lin | H01L 23/467 | 165/80.3 |
| 2003/0221815 A1* | 12/2003 | Wang | H01L 23/473 | 165/80.3 |
| 2004/0011508 A1* | 1/2004 | Tan | H01L 23/467 | 165/80.3 |
| 2004/0118552 A1* | 6/2004 | Huang | F21V 29/773 | 165/80.3 |
| 2004/0200601 A1* | 10/2004 | Bamford | H01L 23/467 | 165/80.3 |
| 2004/0226690 A1* | 11/2004 | Lee | F28D 15/02 | 165/80.2 |
| 2004/0244947 A1* | 12/2004 | Chen | H01L 23/3672 | 165/80.3 |
| 2004/0261975 A1* | 12/2004 | Kozyra | H01L 23/467 | 165/80.3 |
| 2005/0039881 A1* | 2/2005 | Reyzin | F28D 15/02 | 165/80.3 |
| 2005/0039882 A1* | 2/2005 | Griesmayer | H01L 23/3677 | 165/80.3 |
| 2005/0045308 A1* | 3/2005 | Wang | H01L 23/427 | 165/80.3 |
| 2005/0056399 A1* | 3/2005 | Ku | H01L 23/467 | 165/80.3 |
| 2005/0056405 A1* | 3/2005 | Hashimoto | F04D 29/30 | 165/104.33 |
| 2005/0061478 A1* | 3/2005 | Huang | H01L 23/467 | 165/80.3 |
| 2005/0077027 A1* | 4/2005 | Lopatinsky | H01L 23/467 | 165/80.3 |
| 2005/0133197 A1* | 6/2005 | Chang | H01L 23/467 | 165/80.3 |
| 2005/0178527 A1* | 8/2005 | Wang | H01L 23/467 | 165/80.3 |
| 2005/0211416 A1* | 9/2005 | Kawabata | H01L 21/4882 | 165/80.3 |
| 2005/0252639 A1 | 11/2005 | Lin | | |
| 2005/0252640 A1 | 11/2005 | Chang | | |
| 2006/0011324 A1* | 1/2006 | Rogers | H01L 23/467 | 165/80.3 |
| 2006/0021735 A1* | 2/2006 | Lopatinsky | H01L 23/467 | 165/80.3 |
| 2006/0042777 A1* | 3/2006 | Delano | F04D 29/541 | 165/8 |
| 2006/0042782 A1* | 3/2006 | Chen | H01L 23/467 | 165/80.3 |
| 2006/0061970 A1* | 3/2006 | Lee | G06F 1/20 | 361/709 |
| 2006/0092613 A1* | 5/2006 | Kao | H01L 23/3672 | 361/704 |
| 2006/0131000 A1* | 6/2006 | Liu | H01L 23/467 | 165/80.3 |
| 2006/0185820 A1* | 8/2006 | Chen | H01L 23/3736 | 165/80.3 |
| 2006/0185821 A1* | 8/2006 | Chen | H01L 23/427 | 165/80.3 |
| 2006/0187642 A1 | 8/2006 | Jeong | | |
| 2006/0196636 A1* | 9/2006 | Liu | H01L 23/467 | 165/80.3 |
| 2006/0196637 A1* | 9/2006 | Scott | H01L 23/467 | 165/80.3 |
| 2006/0198107 A1* | 9/2006 | Azar | H01L 23/4093 | 361/704 |
| 2006/0213642 A1* | 9/2006 | Lai | H01L 21/4882 | 165/80.3 |
| 2006/0219386 A1* | 10/2006 | Hsia | H01L 23/467 | 165/80.3 |
| 2006/0225866 A1* | 10/2006 | Chen | H01L 23/467 | 165/80.3 |
| 2007/0058343 A1* | 3/2007 | Deng | H01L 23/4006 | 361/695 |
| 2007/0074849 A1* | 4/2007 | Joshi | H01L 23/473 | 165/80.3 |
| 2007/0084595 A1* | 4/2007 | Lin | F21V 29/773 | 165/185 |
| 2007/0199677 A1* | 8/2007 | Hwang | H01L 23/467 | 165/80.3 |
| 2007/0204972 A1* | 9/2007 | Edward | F28F 3/022 | 165/80.3 |
| 2007/0215323 A1* | 9/2007 | Hsu | H01L 23/3733 | 165/80.3 |
| 2007/0215336 A1* | 9/2007 | Hsu | H01L 23/367 | 165/185 |
| 2007/0277958 A1* | 12/2007 | Huang | H01L 23/467 | 165/80.3 |
| 2007/0297133 A1* | 12/2007 | Chen | G06F 1/20 | 361/695 |
| 2008/0000618 A1* | 1/2008 | Liang | H01L 23/4093 | 165/80.3 |
| 2008/0017349 A1 | 1/2008 | Li et al. | | |
| 2008/0066898 A1* | 3/2008 | Lai | H01L 23/467 | 165/185 |
| 2008/0078527 A1* | 4/2008 | Lofland | F04D 29/601 | 165/80.3 |
| 2008/0080137 A1 | 4/2008 | Otsuki et al. | | |
| 2008/0117594 A1* | 5/2008 | Hwang | F04D 29/4246 | 361/697 |
| 2008/0142194 A1* | 6/2008 | Zhou | F28D 1/0472 | 165/80.3 |
| 2008/0149305 A1* | 6/2008 | Chen | F21V 29/767 | 165/80.3 |
| 2008/0149306 A1* | 6/2008 | Hwang | F04D 29/626 | 165/80.3 |
| 2008/0156461 A1* | 7/2008 | Otsuki | F04D 29/582 | 165/80.3 |
| 2008/0202502 A1 | 8/2008 | Eckhardt | | |
| 2008/0210404 A1* | 9/2008 | Peng | H01L 23/427 | 165/80.3 |
| 2008/0223551 A1* | 9/2008 | Otsuki | H01L 23/467 | 165/80.3 |
| 2008/0230209 A1* | 9/2008 | Khalili | F28D 15/0275 | 165/104.33 |
| 2008/0236788 A1* | 10/2008 | Joshi | G06F 1/203 | 165/80.3 |
| 2008/0277094 A1* | 11/2008 | Peng | F04D 25/0653 | 165/80.3 |
| 2008/0302507 A1* | 12/2008 | Chen | H01L 23/36 | 165/80.3 |
| 2008/0302510 A1* | 12/2008 | Ouyang | F28F 13/02 | 165/80.3 |
| 2009/0008067 A1* | 1/2009 | Kuan | F04D 29/582 | 165/121 |
| 2009/0014154 A1* | 1/2009 | Schick | F28F 1/34 | 165/80.3 |
| 2009/0025906 A1* | 1/2009 | Huang | H01L 23/467 | 165/80.3 |
| 2009/0050293 A1* | 2/2009 | Kuo | H01L 23/367 | 165/80.3 |
| 2009/0050303 A1 | 2/2009 | Komori et al. | | |
| 2009/0071624 A1* | 3/2009 | Zhang | F21V 29/76 | 165/80.3 |

(56) References Cited

U.S. PATENT DOCUMENTS

| | | | |
|---|---|---|---|
| 2009/0101307 A1* | 4/2009 | Kumar | H01L 23/3672 165/80.3 |
| 2009/0120613 A1* | 5/2009 | Chen | H01L 23/4093 165/80.3 |
| 2009/0145581 A1* | 6/2009 | Hoffman | H01L 23/473 165/80.3 |
| 2009/0151900 A1* | 6/2009 | Huang | H01L 23/467 165/80.3 |
| 2009/0199997 A1* | 8/2009 | Koplow | F28F 3/02 165/80.3 |
| 2009/0211729 A1* | 8/2009 | Wang | H01L 23/467 165/80.3 |
| 2009/0263232 A1 | 10/2009 | Jarrah | |
| 2009/0310306 A1* | 12/2009 | Yu | H01L 23/467 361/697 |

FOREIGN PATENT DOCUMENTS

| | | |
|---|---|---|
| EP | D892431 B1 | 9/2009 |
| GB | 2377321 A | 1/2003 |
| WO | 02/0933643 A1 | 11/2002 |

\* cited by examiner

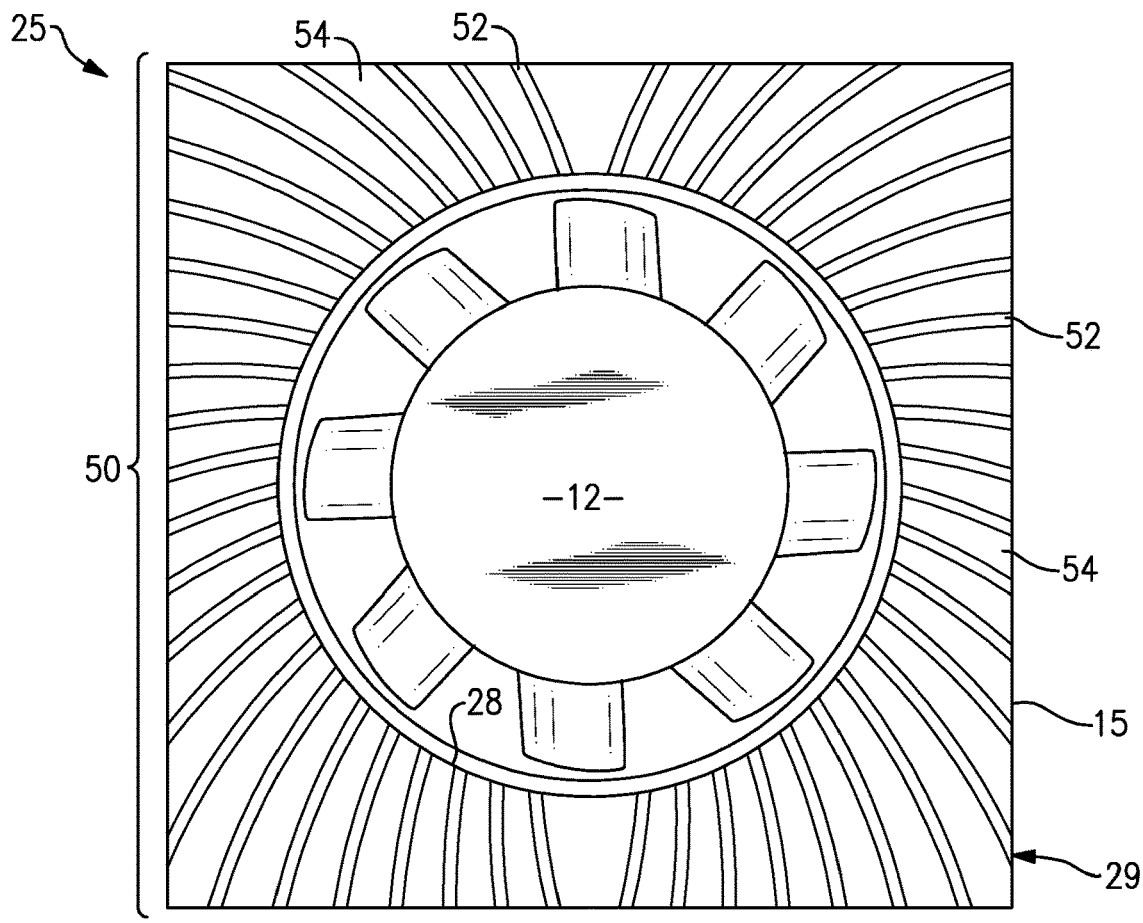
FIG.3
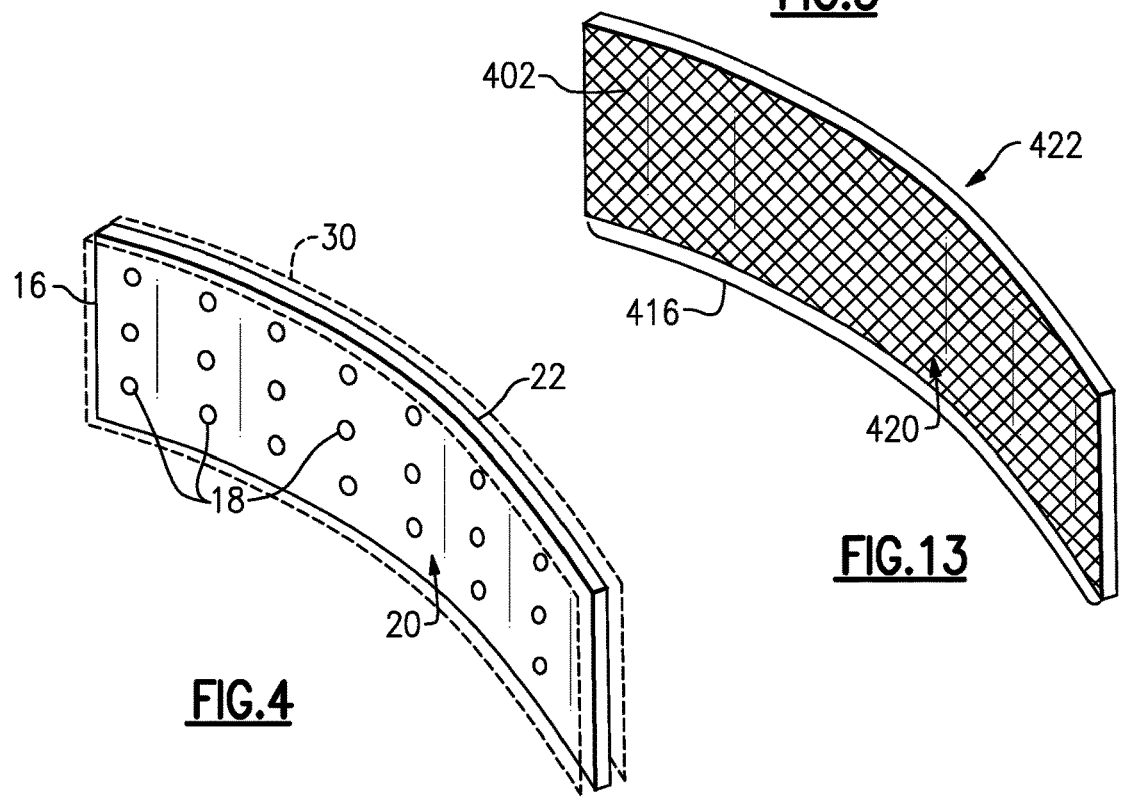
FIG.13
FIG.4

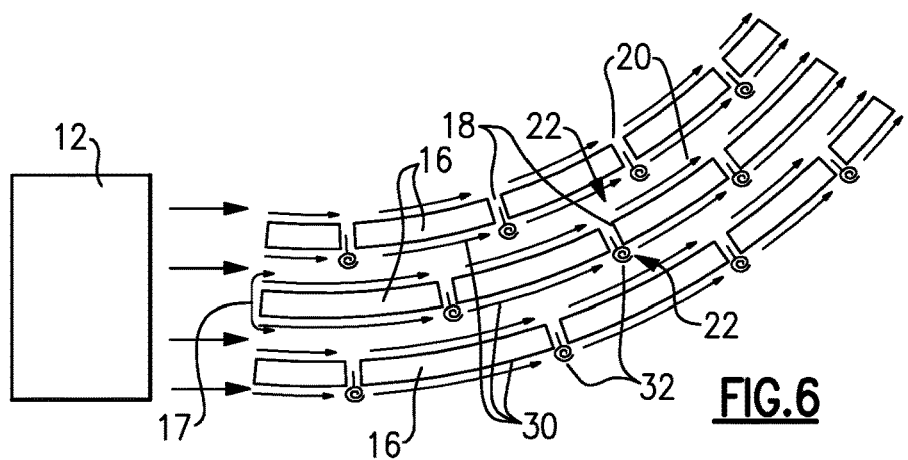
FIG. 6
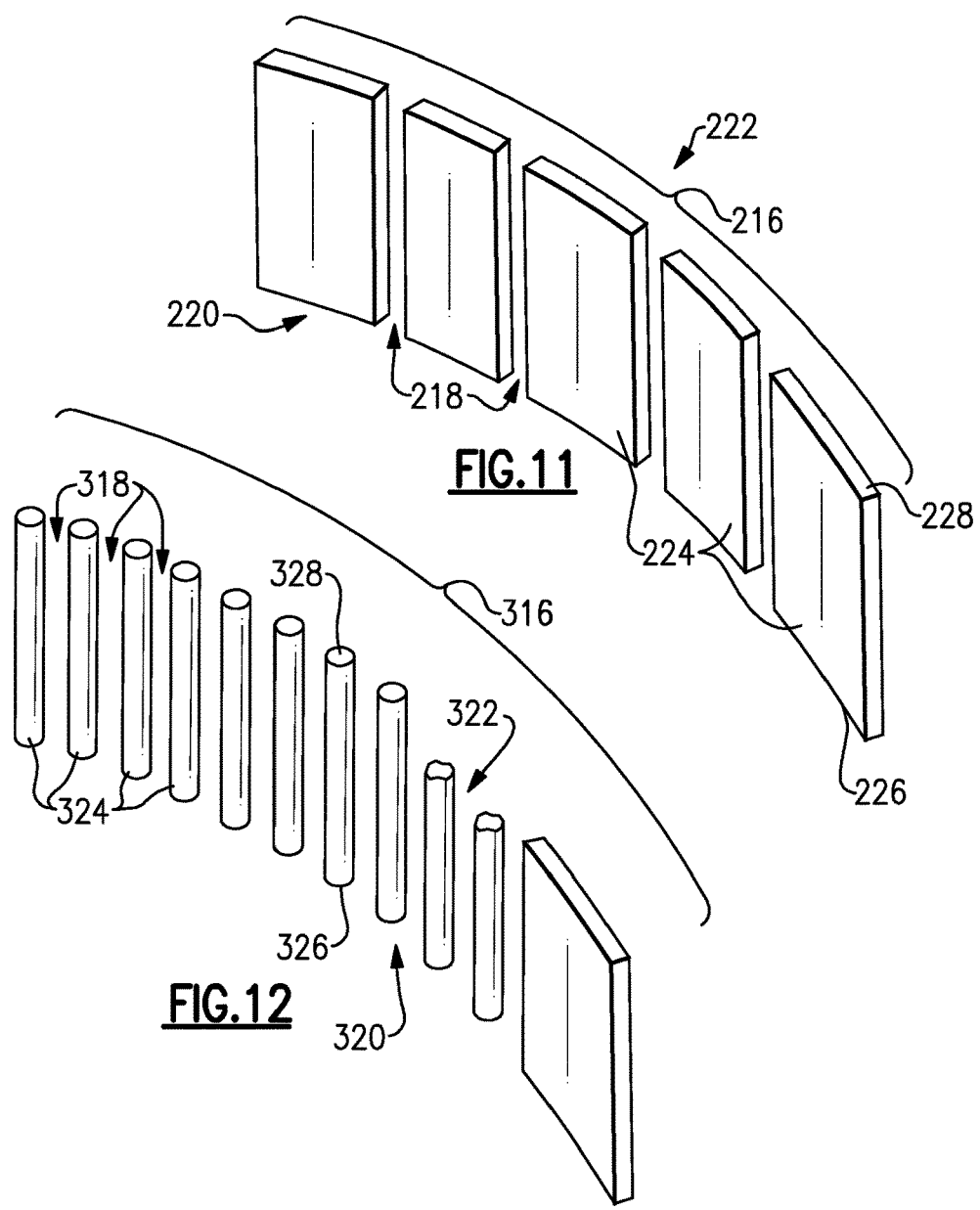
FIG. 11
FIG. 12

HEAT TRANSFER DEVICE WITH FINS DEFINING AIR FLOW CHANNELS

CROSS-REFERENCE TO RELATED APPLICATION

This application is a continuation of U.S. patent application Ser. No. 12/732,320, filed Mar. 26, 2010.

BACKGROUND

This disclosure generally relates a high performance cooling system. More particularly, this disclosure relates to a cooling system including curved heat sinks fins.

A cooling system is typically utilized to control a temperature of heat producing components, such as high performance electronic components. Known cooling systems typically include thermally conductive heat transfer devices including a plurality of fins. The cooling system is positioned in thermal contact with the heat producing component to remove the heat and control temperature. The heat transfer device is typically further cooled by air flow directed over and through the heat transfer device fins.

SUMMARY

An exemplary cooling system includes a heat transfer device having a base and a plurality of curved fins defining a curved air flow channel. Air flow is provided through the air flow channel, and a plurality of openings through a fin communicate air flow from a first side to a second side of the curved fin.

An exemplary heat transfer device includes a base and a plurality of curved fins. The plurality of curved fins define curved air flow channels and have a plurality of openings allowing communication of air flow from a high pressure side to a low pressure side to disrupt air flow in the corresponding channel.

An exemplary heat transfer device includes a plurality of fins defining a corresponding plurality of air flow channels. Each of the plurality of fins has a plurality of openings for communicating air flow from a first side to a second side to disrupt air flow through the corresponding air flow channel. There is also a plurality of protrusions on the fin extending at least partially into the air flow channel.

An exemplary method for cooling a heat producing device is disclosed. A plurality of curved fins is adapted to absorb heat from a source. Air flow is then directed through curved channels defined between the plurality of curved fins. Air flow is communicated through the plurality of curved fins into an adjacent curved channel to disrupt air flow through the adjacent curved channel.

These and other features of the disclosed example can be best understood from the following specification and drawings, the following of which is a brief description.

BRIEF DESCRIPTION OF THE DRAWINGS

FIG. 3 is a partial sectional view of another example cooling system with air flow source and radial heat sink.

FIG. 4 is a side view of a curved fin with a plurality of openings.

FIG. 6 is a schematic view of a plurality of curved fins and openings.

FIG. 11 is a sectional view of a plurality of slotted fin sections forming a curved fin.

FIG. 12 is a sectional view of a plurality of pin fin sections forming a curved fin.

FIG. 13 is a sectional view of a curved porous fin.

DETAILED DESCRIPTION

Figure 1:
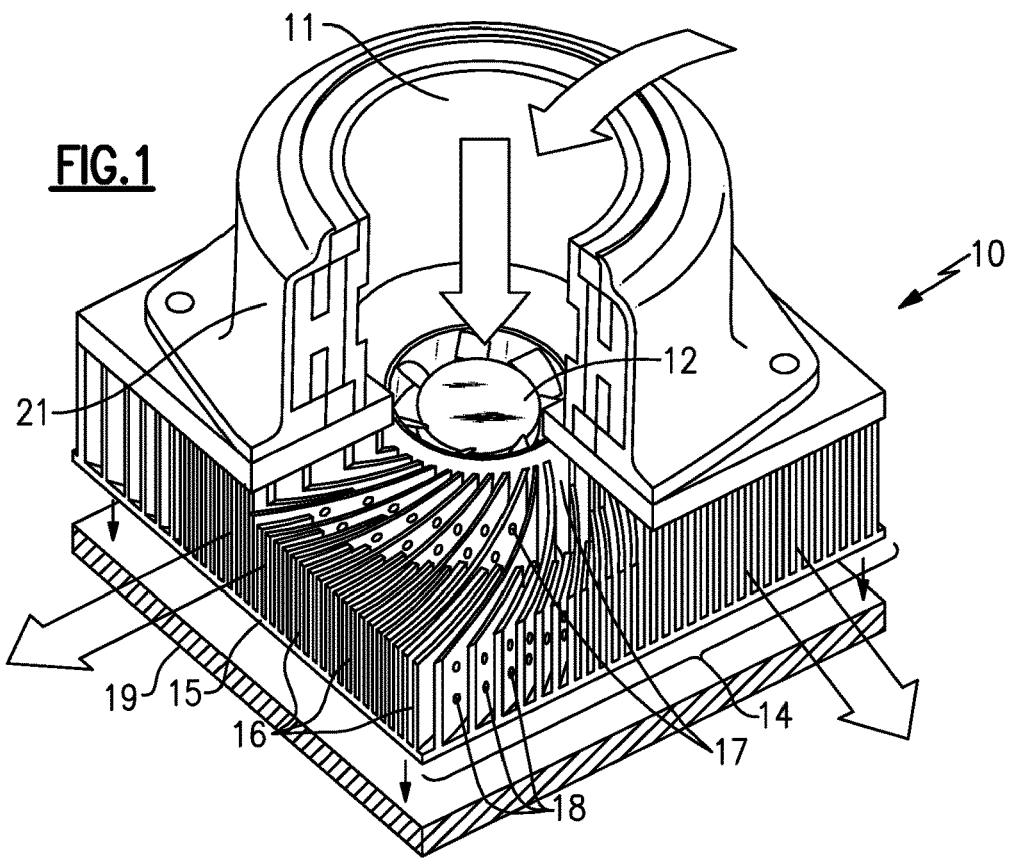
FIG. 1 is a partial sectional view of an example cooling system including an air flow source and a heat transfer device.

Referring to FIG. 1, an example cooling system 10 includes a heat transfer device. As shown in FIG. 1, the heat transfer device is a heat sink 14 placed in thermal contact with a heat producing device 19. However, other known heat transfer devices are within the contemplation of this disclosure. In this example, the heat producing device 19 is an electronic device; however, this disclosure may benefit other heat producing devices. The heat sink 14 includes a base 15 and a plurality of curved fins 16. The plurality of curved fins 16 define curved air flow channels 17. A motor 21 is attached to the heat sink 14 and powers a fan 12 mounted to a central area 11 of the base 15. Air is pulled down through the motor 21 by the fan 12 and sent through the curved channels 17. Alternatively, air is pulled through the heat sink by other known devices. Heat produced by the heat producing device 19 is transferred to the base 15 and plurality of fins 16. The air flow through the curved channels 17 against the plurality of curved fins 16 and the base 15 carries away heat. The example curved fins 16 include openings 18 which allow communication of air flow through the curved fins 16 between adjacent curved channels 17. As is clear, the holes 18 extend between the two sides of the fins, with there being fin material both on a side of the fins between the base and the holes, and on an opposed side space away from the base. The air driven through the curved fins 16 disrupts a boundary layer of airflow to increase cooling capacity of the example cooling system 10. Examples of the heat producing device 19 with which the cooling system 10 can be used include, but are not limited to, microprocessors, car conversion electronics, power switches, and telecommunications equipment.

Figure 2A:
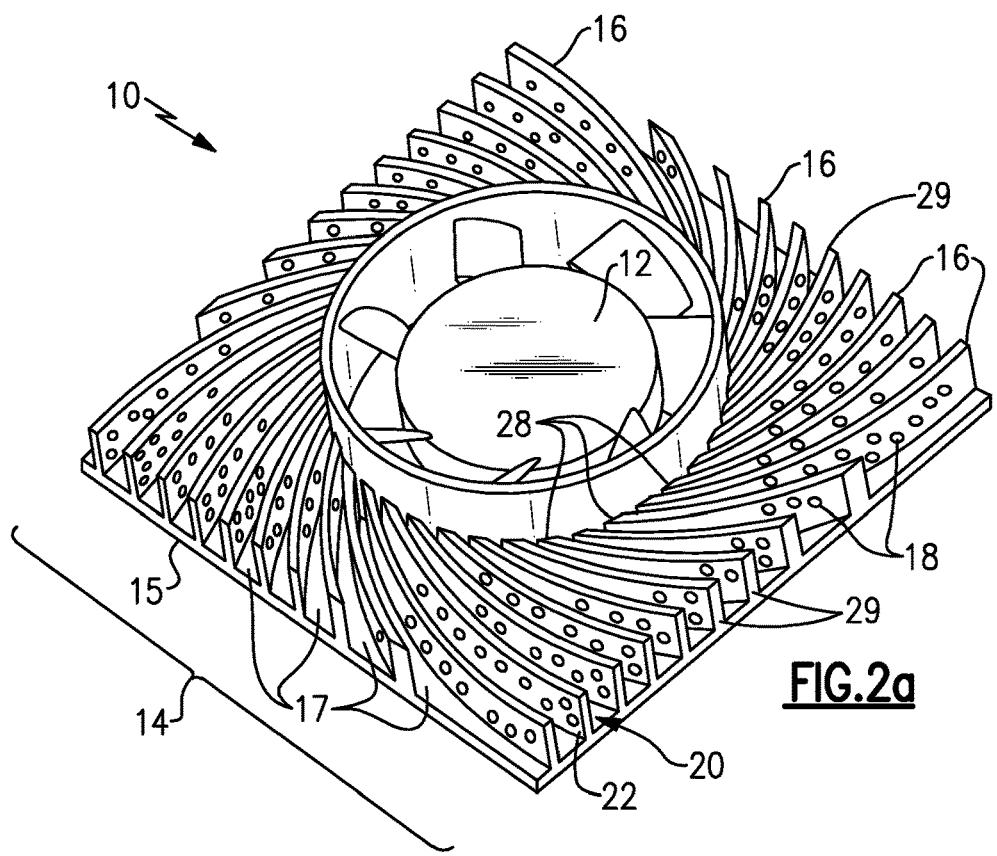
FIG. 2a is a partial sectional view of the example cooling system with air flow source and radial heat sink.

Referring to FIG. 2a, an example air flow source is fan 12. However, other known devices are within the contemplation of this disclosure. The example cooling system 10 include a heat sink 14 with the base 15 and an inner housing 28 for the fan 12. The heat sink 14 is a radial heat sink. The curved fins 16 originate at the inner housing 28 of the heat sink 14 and extend in a curved direction to the outer side 29 of the heat sink 14 forming the curved air flow channels 17. Each of the curved air flow channels 17 are defined by opposing sides of two curved fins 16 correspondingly curved. The curved channels 17 follow a non-linear path between the interior housing 28 and outer side 29 of the heat sink 14. Due to the shape of the curved fins 16, each of the curved fins 16 include a high pressure side 20 and a low pressure side 22 creating a pressure gradient across the curved fins 16. The openings 18 of the curved fins 16 communicate air between the high pressure side 20 and the low pressure side 22 of the curved fin 16. The curved fins 16 can be made of copper, aluminum, or other known thermally conductive material.

Figure 2B:
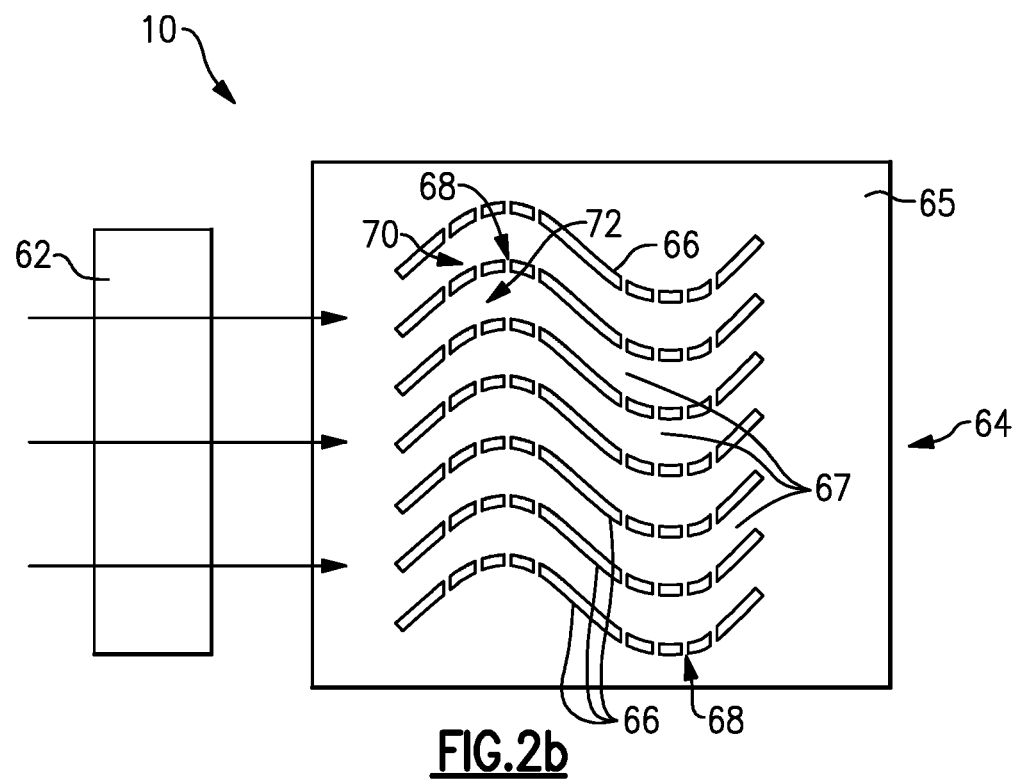
FIG. 2b is a partial schematic view of the example cooling system with air flow source and a linear heat sink.

Referring to FIG. 2b, an example air flow source is a fan 62. The example cooling system 10 includes a linear heat sink 64. The linear heat sink 64 includes fins 66 that extend across the base 65 such that the ends of the adjacent curved channels 67 are linearly aligned. Therefore, the curved fins 66 are aligned in a generally parallel manner across the base 65. The fan 62 provides linear air flow through the curved fins 66 of the linear heat sink 64. Each of the curved air flow channels 67 are defined by opposing sides of two curved fins 66 correspondingly curved. Due to the shape of the curved fins 66, each of the curved fins 66 include a high pressure side 70 and a low pressure side 72 creating a pressure gradient across the curved fins 66. The openings 68 of the curved fins 66 communicate air between the high pressure side 70 and the low pressure side 72 of the curved fin 66.

Referring to FIG. 3, with continued reference to FIG. 2a, another example system 25 includes a fan 12 and a heat sink 50 with a base 15 and inner housing 28 for the fan 12. The curved fins 52 originate at the inner housing 28 and extend in a curved direction to the outer side 29 of the heat sink 50 forming curved air flow channels 54. Due to the shape of the curved fins 52, each of the curved fins 52 include a high pressure side 20 which is convexly shaped and a low pressure side 22 which is concavely shaped creating a pressure gradient across the curved fins 52. Neither the curved fins 52 nor the curved channels 54 are uniformly curved. The curved fins 52 instead curve in opposite directions such that the convex high pressure sides 20 of at least two curved fins 52 and the concave low pressure sides 22 of at least two curved fins 52 face each other.

Referring to FIG. 4, with continued reference to FIG. 2a, the shape of the curved fins 16 creates a pressure gradient across the curved fins 16, resulting in the high pressure side 20 and the low pressure side 22. The high pressure side 20 is the convex side of the curved fins 16 while the low pressure side 22 is the concave side of the curved fins 16.

The example openings are holes 18. The holes 18 in the curved fins 16 provide for air flow between the high pressure side 20 and the low pressure side 22. The holes 18, can be arranged an equal distance apart, or alternatively, in any manner which aides the cooling of the particular cooling system 10. The flow of air around the curved fins 16 includes a boundary layer 30, which has an increased temperature due to its close proximity to the heat from the curved fins 16.

Figure 5:
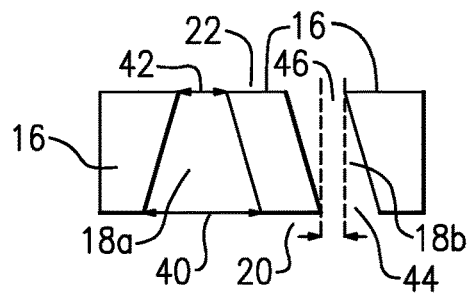
FIG. 5 is a sectional view of tapered and offset openings through a curved fin.

Referring to FIG. 5, the example openings are holes 18 in the curved fins 16 that are altered to aide air flow between the high pressure side 20 and low pressure side 22. The holes 18 can be drilled into the curved fins 16 at angles, or added by other known means. In one example, a hole 18a is tapered through the fin 16. When the holes 18a are tapered into the fin 16, the hole 18a has a larger first diameter 40 on the high pressure side 20 and a smaller second diameter 42 on the low pressure side 22. The difference in diameters induces increased air flow through the hole 18a between the high pressure side 20 and low pressure side 22.

In another example, holes 18b are offset across the fin 16. When the holes 18 are offset across the fin 16, a first opening 44 is offset from a second opening 46, effectively creating an angle relative to the curved fin 16. Offsetting the first opening 44 and second opening 46 increases air flow from the high pressure side 20 to the low pressure side 22. Alternatively, the holes 18 may be altered in any manner which aides airflow from a high pressure side 20 of the curved fin 16 to a low pressure side 22 of a curved fins 16.

Referring to FIG. 6, with continued reference to FIGS. 2a, 2b, and 3, the fan 12 provides air to cool the curved fins 16 of the heat sink 14. The curved fins 16 define the curved channels 17 for air to flow in communication with the curved fins 16. A boundary layer, indicated by arrows 30, of air is generated along the surface of the curved fins 16. The relatively high temperature of the curved fins 16 causes air in the boundary layer 30 to have a temperature greater than air spaced further away from the fins 16. The pressure gradient across the fins 16 created by the shape of the curved fins 16, and resulting in the high pressure side 20 and the low pressure side 22, causes air to move through the holes 18 from the high pressure side 20 to the low pressure side 22. The air flow through the fins 16 creates jets 32 that disrupt the boundary layer 30 of air flow. The jets 32 created from movement of air through the holes 18 cause the higher temperature air in the boundary layer 30 to mix with the cooler air flow within the channels 17 to increase cooling.

Figure 7:
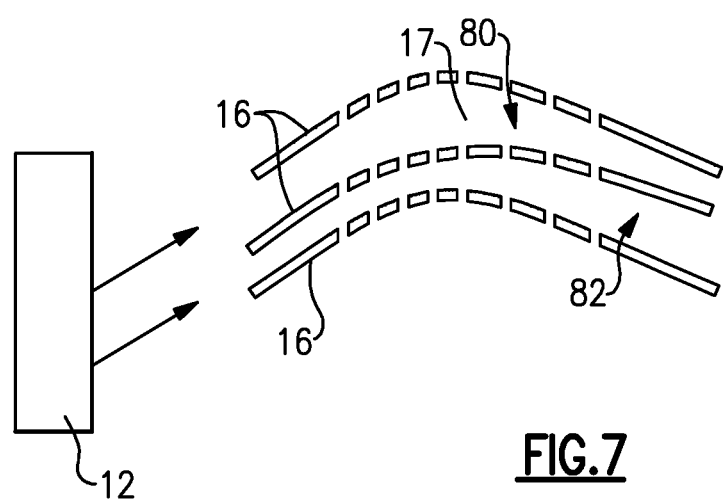
FIG. 7 is a schematic view of convergent and divergent curved channels.

Referring to FIG. 7, with continued reference to FIG. 6, the size and shape of the curved channels 17 as well as the curvature of the curved fins 16 may be adjusted to gain the greatest efficiency based on the needs of the cooling system 10. Further, these aspects may be adjusted to allow use with many different electrical components and electrical systems. When air flow from the fan 12 through the curved channels 17 accelerates, the pressure across the curved fins 16 drops. When air flow from the fan 12 through the curved channels 17 decelerates, the pressure increases. An example curved channel 17 can be a diverging curved channel 80, where the curved fins 16 defining the curved channel 17 move closer together to narrow a portion of the curved channel 17. Similarly, an example curved channel 17 can be a converging curved channel 82, where the curved fins 16 defining the curved channel 17 move further apart to widen a portion of the curved channel 17. A pressure difference is created to cause air to move through the openings 18 by arranging a diverging curved channel 80 and converging curved channel 82 to be adjacent.

An example system 10 moves portions of the curved fins 16 closer together results in smaller curved channels 17 with a greater pressure gradient due to higher fin surface area relative to channel volume ratios. The air flow being provided to the curved channels 17 remains the same, thus increased pressure results if curved channels 17 are moved closer together. The increased pressure provides for flexibility in the size and spacing of holes 18. Holes 18 with increased size produce a lower pressure gradient that can be counteracted by moving the curved channels 17 closer together. Similarly, if the holes 18 are reduced in size, the curved channels 17 can be moved farther apart to maintain a desired pressure gradient across the curved fins 16.

Figure 8:
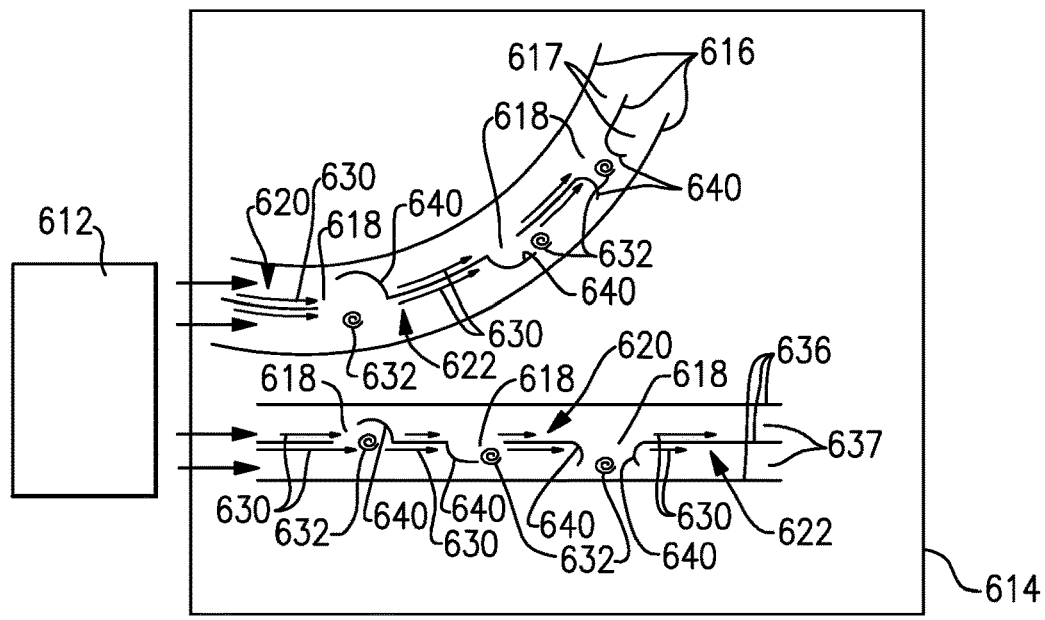
FIG. 8 is a schematic view of channels including protrusions.

Referring to FIG. 8, the fan 612 provides air to cool the fins 616, 636 of the heat sink 614. The fins may be curved fins 616 defining curved channels 617 or straight fins 636 define the linear channels 637 for air to flow in communication with the fins 616, 636. A boundary layer, indicated by arrows 630, of air is generated along the surface of the fins 616, 636. The relatively high temperature of the fins 616, 636 causes air in the boundary layer 630 to have a temperature greater than air spaced further away from the fins 616, 636. Protrusions 640 of the fins 616, 636 cause air to move through the openings 618 from a first side 620 to a second side 622. The air flow through the fins 616, 636 creates jets 632 that disrupt the boundary layer 630 of air flow. The jets 632 created from movement of air through the openings 618 cause the higher temperature air in the boundary layer 630 to mix with the cooler air flow within the channels 617, 637 to increase cooling. The protrusions 640 also disrupt the boundary layer 630 of air flow.

Figure 9A:
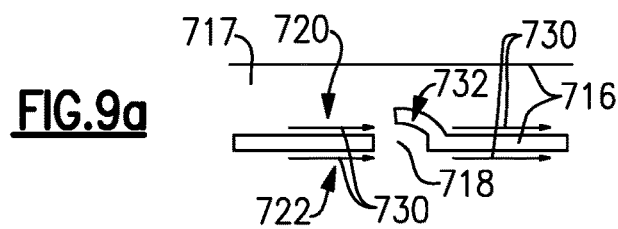
FIG. 9a is a sectional view of a fin with a protrusion that is a scoop.
Figure 9B:
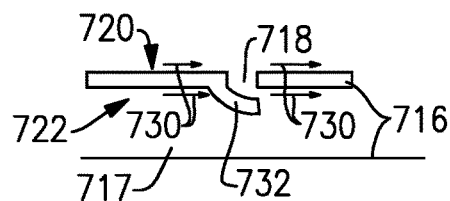
FIG. 9b is a second sectional view of a fin with a protrusion that is a scoop.

Referring to FIG. 9a, with continued reference to FIG. 8, an example fin 716 includes a protrusion that is a scoop 732. The scoop 732 extends away from the fin 716 into the channel 717. The scoop 732 is curved to move air flow in the boundary layer 730 of the first side 720 of the fin 716 through the opening 718 from a first side 720 of the fin 716 to a second side 722 of the fin 716. Alternatively, referring to FIG. 9b, with continued reference to FIG. 8, the scoop 732 extends away from the fin into the channel 717 on the second side 722. The scoop 732 is curved to disrupt air flow in the boundary layer 730 of the second side 722 of the fin 716 as well as aide air flow moving through an opening 718 further along the channel 717 on the second side 722 of the fin 716

Figure 9C:
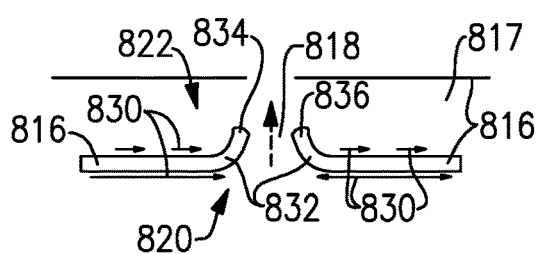
FIG. 9c is a sectional view of a fin with a protrusion that is a drawn hole.

Referring to FIG. 9c, with continued reference to FIG. 8, an example fin 816 includes a protrusion that is a drawn hole 832. The drawn hole 832 can be punched through the fin 816, or made in other known ways. The opening 818 is defined by a first end 834 and a second end 836 which are curved into the channel 817 such that they protrude into the channel 817. The opening 818 created by the ends 834, 836 allows air to flow from a first side 820 of the fin 816 to a second side 822 of the fin 816. The ends 834, 836 are also curved such that they disrupt air flow through the boundary layer 830 of the channel 817.

Figure 10:
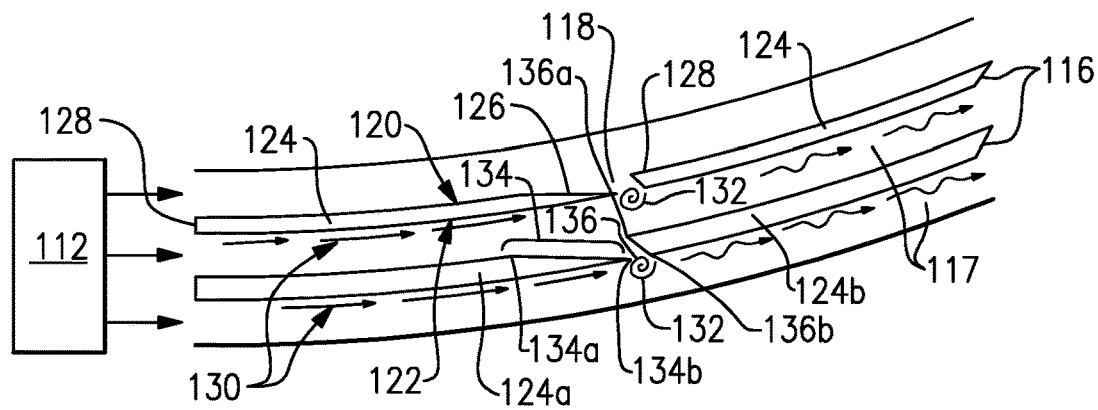
FIG. 10 is a schematic view of another example plurality of curved fins including of different sections.

Referring to FIG. 10, with continued reference to FIG. 6, another example curved fin 116 includes a number of sections 124. Openings 118 exist as the space between the sections 124, and communicate air from a high pressure side 120 to a low pressure side 122. The example curved fin sections 124 are aligned to maintain a desired curvature for generating the desired pressure gradient. Air flow through the openings 118 creates jets 132 which disrupt air in boundary layers 130. As a result of the jets 132, the air in the boundary layers 130 is forced away from the curved fins 116 and mixes with cooler air in the channels 117.

Each section 124 of the example curved fin 116 includes a trailing end 126 and a leading end 128. The trailing end 126 of a first section 124a forms an opening 118 with the leading end 128 of a second section 124b. The example trailing end 126 and leading end 128 are tapered to aide air flow through the opening 118. The trailing end 126 includes an inwardly decreasing edge from the high pressure side 120 to the low pressure side 122 creating a trailing edge 134. The trailing edge 134 begins at a first point 134a on the curved fin 116 and continues along the inwardly decreasing edge to the second point 134b on the curved fin 116 further towards the outer side 29 of the heat sink 14.

The leading end 128 includes an outwardly increasing edge from the high pressure side 120 to the low pressure side 122 creating a leading edge 136. The leading edge 136 begins at a first point 136a on the curved fin 116 and continues along the outwardly increasing edge to a second point 136b on the curved fin further towards the outer side 29 of the heat sink 14. When the openings 118 exist in the space between each trailing end 126 and leading end 128, they can be any height, including the entire height of the curved fin 116.

Referring to FIG. 11, with continued reference to FIG. 6, the sections 224 forming the curved fin 216 are aligned to maintain a high pressure side 220 and a low pressure side 222 to create a pressure gradient. The pressure gradient drives air flow through slots 218 defined by the sections 224. In the disclosed example arrangement, the sections 224 are arranged to form a curved fin 216 and allow air to flow through the slots 218. The slots 218 extend from the bottom side 226 to the top side 228 of the curved fin 216; however, slots 218 of other lengths are within the contemplation of this disclosure.

Referring to FIG. 12, with continued reference to FIG. 6, another example, curved fin 316 is shown. The example curved fin 316 includes a plurality of pin fins 324 arranged in the desired curved shape. The example curved fin 316 includes a low pressure side 320 and a high pressure side 322 creating a pressure gradient across the curved fin 316. The spaces between the pin fins 324 define openings 318 for air flow through the fin 316. The openings 318 may extend the entire height of the curved fin 316. The height of the openings 318 depends on the height of the curved fins 316 at particular placements along the curved fin 316. The height of the curved fins 316 is defined as the distance between the bottom side 326 and top side 328 of the curved fins 316. The curved fins 316 may be of varying height to provide openings 318 of varying sizes.

Referring to FIG. 13, another example curved fin 416 is shown. The curved fin 416 is thermally conductive material having a porous structure 402. The porous structure 402 provide for air to move through the fin 416. A high pressure side 420 and a low pressure side 422 exist to create a pressure gradient, causing air to flow through the porous structure 402 of the curved fin 416 from the high pressure side 420 to the low pressure side 422. The example porous structure 402 is a thermally conductive foam, such as carbon foam. It is within the contemplation of this example to utilize other porous materials that provide a desired air flow in response to generated pressure differential.

Figure 14:
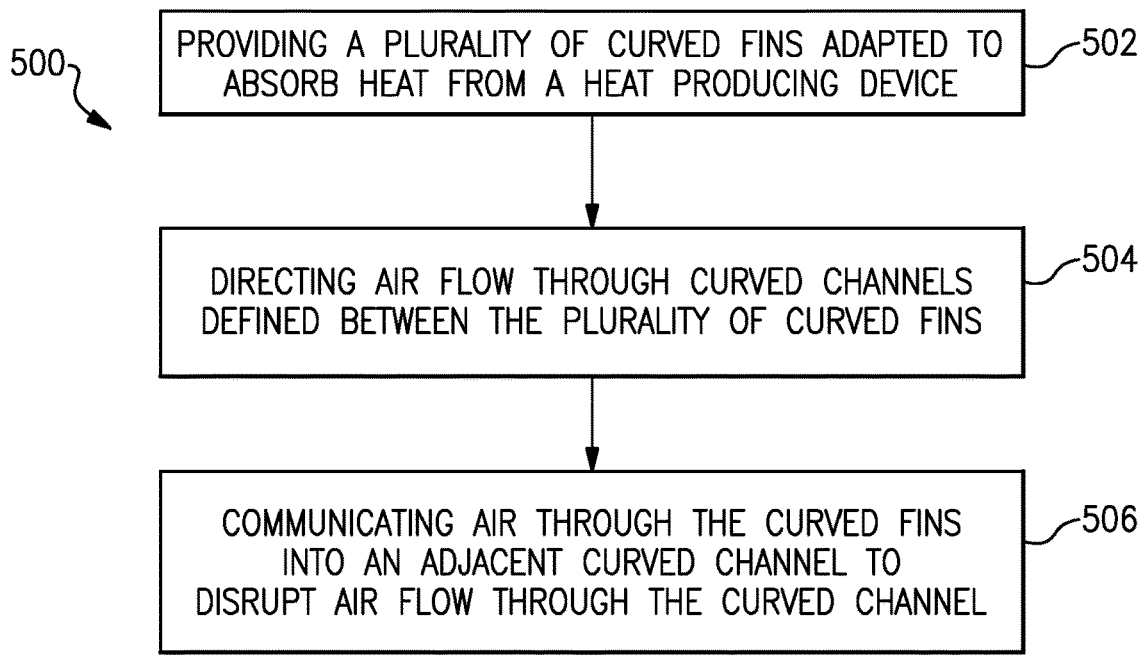
FIG. 14 is a method for cooling a system using a heat transfer device.

Referring to FIG. 14, an example method for cooling a heat producing device is schematically shown at 500 and includes the initial step of providing a plurality of curved fins adapted to absorb heat from the heat producing device as indicated at 502. The plurality of fins 16 define a plurality of curved channels 17. Air flow is created through the curved channels 17 as indicated at 504. The curved shape of the air flow channels 17 creates a pressure differential across each of the fins 16. Each of the plurality of fins 16 include openings through which air is drawn through the fin 16. Air from a high pressure side of the fin 16 is drawn through the fins 16 as indicated at 506. Air flowing through the fins 16 is expelled into the adjacent channel 17 to disrupt air flow as further indicated at 506 Disruption of air flow mixes hot air traveling along the surface of the fins 16 with cooler air flowing in a center portion of the channels 17. This mixes air flow providing improved heat transfer capability.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A heat transfer device comprising:
   a base; and
   a plurality of curved fins defining a corresponding plurality of curved air flow channels supported on the base, each of the plurality of curved fins having a plurality of openings for communicating air flow from a high pressure side to a low pressure side to disrupt air flow through the corresponding curved air flow channel;
   a fan, spaced ones of said plurality of curved pins providing an inlet into said curved air flow channels at a central portion of said base from said fan and extending outwardly to outlets spaced away from said fan, said fan being configured to move air through said curved airflow channels; and
   said openings extending between said low pressure side and said high pressure side of said curved fin, and there being material on a side of said openings extending towards said base, and on a side of said openings extending away from said base.

2. The heat transfer device of claim 1, wherein the hole is tapered.

3. The heat transfer device of claim 1, wherein a first of said holes opening on the high pressure side is offset along the curved fin from a second of said holes opening on the low pressure side.

4. A heat transfer device comprising:
   a base; and
   a plurality of curved fins defining a corresponding plurality of curved air flow channels supported on the base, wherein the plurality of curved air flow channels define a non-linear path extending along a first surface of the base between a first position on the base and a second position on the base, each of the plurality of curved fins having a plurality of openings for communicating air flow from a high pressure side to a low pressure side to disrupt air flow through the corresponding curved air flow channel;
   wherein at least one of the plurality of curved fins includes a plurality of spaced apart sections; wherein each of the plurality of curved fins include a plurality of spaced apart sections, and wherein said plurality of openings are defined by spaces between said plurality of spaced apart sections, and wherein said plurality of spaced apart section is a pin fin, with said pin fins being positioned to define said curved airflow channels.

5. The heat transfer device of claim 4, wherein at least one of the plurality of spaced apart sections includes a tapered end.

6. The heat transfer device of claim 1, wherein the plurality of curved air flow channels include a convergent curved channel.

7. The heat transfer device of claim 1, wherein the plurality of curved air flow channel include a divergent curved channel.

8. The heat transfer device of claim 1, wherein the curved fin is formed of a porous material.

9. The heat transfer device of claim 1, wherein the heat transfer device is a radial heat sink.

10. The heat transfer device of claim 1, wherein the heat transfer device is a linear heat sink.

11. The heat transfer device of claim 1, wherein the curved fins include a plurality of protrusions into at least one of the plurality of curved air flow channels.

12. The heat transfer device of claim 11, wherein the plurality of protrusions are at least one of a drawn hole or a scoop.

13. The heat transfer device of claim 4, wherein the plurality of curved air flow channels include a convergent curved channel.

14. The heat transfer device of claim 4, wherein the plurality of curved air flow channel include a divergent curved channel.

15. The heat transfer device of claim 4, wherein the heat transfer device is a radial heat sink.

16. The heat transfer device of claim 4, wherein the heat transfer device is a linear heat sink.

* * * * *